(12) United States Patent
Kurokawa

(10) Patent No.: US 7,375,356 B2
(45) Date of Patent: May 20, 2008

(54) ELECTRON-BEAM EXPOSURE SYSTEM

(75) Inventor: Masaki Kurokawa, Tokyo (JP)

(73) Assignee: Advantest Corp., Tokyo (JP)

( * ) Notice: Subject to any disclaimer, the term of this patent is extended or adjusted under 35 U.S.C. 154(b) by 101 days.

(21) Appl. No.: 11/472,228

(22) Filed: Jun. 21, 2006

(65) Prior Publication Data

US 2006/0284119 A1    Dec. 21, 2006

(51) Int. Cl.
*H01L 21/027* (2006.01)
*H01J 37/06* (2006.01)
(52) U.S. Cl. ............... 250/492.22; 250/492.2; 250/492.3
(58) Field of Classification Search ............ None
See application file for complete search history.

(56) References Cited

U.S. PATENT DOCUMENTS 6,515,409 B2 *  2/2003  Muraki et al. ............ 313/359.1
6,828,573 B1    12/2004 Kawano et al.
2006/0129967 A1 *  6/2006 Tanaka et al. ............... 716/19

FOREIGN PATENT DOCUMENTS

JP        2003-218014       7/2003

* cited by examiner

*Primary Examiner*—Nikita Wells
(74) *Attorney, Agent, or Firm*—Muramatsu & Associates

(57) ABSTRACT

An electron-beam exposure system includes: density-per-area map generating means configured to divide a certain area on which an electron beam is irradiated into meshes, to figure out a ratio of an area of patterns to be irradiated on each divided region to an area of the divided region, thus to generate a density-per-area map; and proximity-effect correcting means configured to correct exposure of the electron beam by referring to the density-per-area map. The proximity-effect correcting means includes: product-sum arithmetic means which is configured to perform product-sum arithmetic on two-dimensional array data, and addition means which is configured to perform addition arithmetic on the two-dimensional array data; stores, in a first memory, two-dimensional array data on the density per area of the patterns; performs the product-sum arithmetic and the addition a predetermined number of times, and thus calculates the two-dimensional array data on the density per area by a linear conversion; and uses the resultant data as two-dimensional array data on exposure to be used for correcting a proximity effect.

8 Claims, 10 Drawing Sheets

$$\sum_{i=x-3\beta}^{i=x+3\beta} \text{In}(i, y) \frac{1}{\sqrt{\pi}} \exp\left(-\left(\frac{i-x}{\beta}\right)^2\right)$$

$$\sum_{j=y-3\beta}^{j=y+3\beta} \text{In}(x, j) \frac{1}{\sqrt{\pi}} \exp\left(-\left(\frac{j-y}{\beta}\right)^2\right)$$

$C_1 \times \text{Ina}(i, j) + C_2 \times \text{Inb}(i, j) + C_3$ $\text{Ina}(i, j) \times \text{Inb}(i, j)$

ELECTRON-BEAM EXPOSURE SYSTEM

CROSS-REFERENCE TO RELATED APPLICATIONS

This application is based on and claims priority of Japanese Patent Application No. 2005-180182 filed on Jun. 21, 2005, the entire contents of which are being incorporated herein by reference.

BACKGROUND OF THE INVENTION

1. Field of the Invention

The present invention relates to an electron-beam exposure system which corrects a proximity effect in electron-beam exposure.

2. Description of the Prior Art

In these years, electron-beam exposure systems have been increasingly used for forming fine patterns in a lithographic process in manufacturing semiconductor devices and the like.

With regard to electron-beam exposure systems, it is known that a phenomenon in which the line width and the like of a pattern transferred onto a resist is different from its design value stems from influence of what is termed as the proximity effect, in which incident electrons are scattered in the resist.

FIG. 1 is a diagram schematically showing the proximity effect stemming from forward scattering and back scattering of electron beams. In a case where rectangular patterns P1 and P2 which are parallel with each other as shown in FIG. 1A are intended to be exposed, if an electron-beam exposure is performed on the patterns P1 and P2 in accordance with a design pattern indicating a desired pattern, their post-exposure patterns take on patterns P1$a$ and P2$a$, respectively, as shown in FIG. 1B. In other words, the widths of the patterns become larger than the design values in the middle portions respectively of the patterns which face each other. This is because the back scattering of the electron beam from every part of each pattern is greatly influential.

Against the background of such a proximity effect, consideration has been made for various methods of correcting the proximity effect for the purpose of obtaining patterns formed exactly on design values by predicting condition in which an electron-beam is scattered, and by thus changing the exposure.

FIG. 1C shows a method of correcting a proximity effect by changing the intensity of electron-beam irradiation. In a case where patterns are intended to be exposed, if the entire area of each pattern is exposed with a single intensity of electron-beam irradiation, this causes a proximity effect as shown in FIG. 1B. Taking this into consideration, the proximity effect is corrected by reducing the intensity of an electron-beam irradiated on parts (parts denoted by P3 and P4 in FIG. 1C) of the Pattern P1 and P2, the parts being proximate to other patterns.

With regard to a technique concerned with this, for example, Japanese Patent Official Gazette No. 3340387 has disclosed an electron-beam writing system capable of making a precise exposure map without making a shot size finer.

In addition, Japanese Patent Application Official Gazette No. 2003-218014 has disclosed a charged-particle-beam exposure system for making patterns which are highly precise in dimensions by exposing the patterns for extracting parameters in accordance with pattern data for extracting the parameters of a distribution function of exposure intensity on which a proximity-effect correcting process has been performed.

For the purpose of optimizing exposure respectively for patterns to be exposed so that the patterns to be exposed can obtain the same level of energy to be absorbed against the proximity effect, the proximity-effect correcting process for calculating the exposure for each pattern to be exposed on the basis of a distribution function of exposure intensity and a distribution function of accumulated energy, as described above. The distribution function of accumulated energy is expressed by use of the distribution function of exposure intensity and a convolution integral. For example, an equation expressing influence of back scattering by a Gaussian distribution function as shown in Equation (1) is used for the distribution function of accumulated energy.

$$2E(x) = D(x) + \frac{2\eta}{\pi} \int \exp\left(-\frac{(x-x')^2}{\beta^2}\right) D(x')p(x')dx' \qquad \text{Equation (1)}$$

where p denotes a density of patterns with respect to an area (average coverage factor in a mesh), D denotes a distribution of exposure imparted, E denotes an accumulated energy, and $\eta$ denotes a coefficient indicating a ratio of back scattering. In addition, $\beta$ denotes the length of the back scattering, and indicates an amount having a length dimension equivalent, for example, to approximately 8 μm. These parameters vary depending on a material of the substrate and an acceleration voltage of the electron beam.

In the light-hand side of Equation (1), the first and the second terms are referred to as a term expressing the forward scattering and a term expressing the back scattering, respectively. The forward scattering has a larger influence on a narrower range, and the back scattering has a smaller influence on a wider range. In this equation, the effect of the forward scattering is ignored, and it is assumed that the distribution of the imparted exposure is the distribution of energy contributing to sensitizing as it is. In the case where, for example, a voltage of accelerating the electron beam is approximately 50 kV, the length of the forward scattering is not larger than 0.05 μm. As a result, the effect of the forward scattering can be ignored when the calculation is performed for correcting the proximity effect.

If the equation (1) is solved to figure out D, this makes it possible to obtain an appropriate exposure. Such an equation includes a large number of divisions. Arithmetic has been heretofore performed on the equation by use of a CPU. This brings about a problem that the process rate is small. In addition, the correcting of the proximity effect by use of a CPU hinders the CPU from being used efficiently, and accordingly this affects the degree of utilization of the capacity of the exposure system.

Against this background, consideration has been made for increasing the processing rate by dividing a CPU into clusters. However, it takes time to transfer data among the clusters. For this reason, this clusterization has not offered an effective means for solving the problem yet.

Furthermore, a method of figuring out an appropriate exposure by performing a method of successive substitution on D is adopted while solving Equation (1). However, it is difficult to determine whether or not the solution is converged. For this reason, it has been a conventional practice that the calculation is performed to some extent, but that the calculation is terminated after that. As a result, there has been no guarantee that a precise value can be figured out.

SUMMARY OF THE INVENTION

Taking these problems with the conventional techniques into consideration, an object of the present invention is to provide an electron-beam exposure system which corrects the proximity effect occurring in electron-beam exposure precisely and at a higher rate.

The foregoing problems are solved by an electron-beam exposure system characterized by the following features. The electron-beam exposure system includes density-per-area map generating means and proximity-effect correcting means. The density-per-area map generating means is configured to divide a certain area on which an electron beam is irradiated into meshes, and figures out a ratio of an area of patterns to be irradiated on each divided region to an area of the divided region, thus generating a density-per-area map. The proximity-effect correcting means is configured to correct exposure of the electron beam by referring to the density-per-area map. The proximity-effect correcting means includes product-sum arithmetic means which is configured to perform product-sum arithmetic on two-dimensional array data, and addition means which is configured to perform addition arithmetic on the two-dimensional array data. Thus, the proximity-effect correcting means stores, in a first memory, two-dimensional array data on the density per area of patterns included in each of the meshes. The proximity-effect correcting means performs the product-sum arithmetic and the addition a predetermined number of times, and thus calculates the two-dimensional array data on the density per area by a linear conversion. Subsequently, the proximity-effect correcting means stores, in a second memory, the resultant data as two-dimensional array data of data on exposure to be used for correcting the proximity effect.

In the case of the present invention, a chip is divided into a plurality of meshes, and thus a density-per-area map is generated for each mesh. Thereafter, the density per area of each mesh is transferred, as two-dimensional array data, to a texture memory (first memory). Subsequently, the data on the density per area are converted repeatedly, and thus data on appropriate exposure are calculated. The data conversion corresponds to solving the distribution function of the accumulated energy which is expressed with Equation (1) by performing a method of successive substitution on D. If these processes are performed by use of a shader of a graphic processor, this makes it possible to process the data conversion in parallel, and accordingly to correct the proximity effect at a higher rate.

In addition, the electron-beam exposure system according to the foregoing embodiment is characterized in that, in the aforementioned product-sum arithmetic means, the maximum value of the absolute value of the second two-dimensional array data to be obtained therefrom by inputting the first two-dimensional array data thereto is smaller than the maximum value of the absolute value of the first two-dimensional array data.

In a case where the distribution function of the accumulated energy which is expressed with Equation (1) is solved by the method of successive substitution, the result of the calculation is required to be converged. The present invention provides a calculation result that the maximum value of the absolute value of the output (second two-dimensional array data) from a linear functional unit is smaller than the maximum value of the absolute value of the input (first two-dimensional array data) to the linear functional unit. Thereby, the present invention ensures that results from performing the arithmetic a plurality of times are converged. This makes it possible to correct the proximity effect precisely.

DESCRIPTION OF THE PREFERRED EMBODIMENT

Figure 1A:
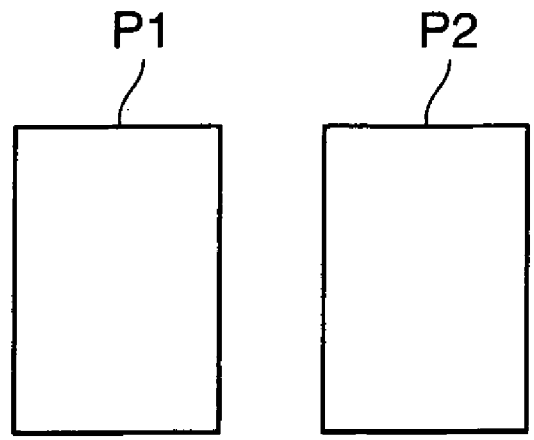
FIGS. 1A to 1C are diagrams for explaining an proximity effect stemming from an electron-beam exposure.
Figure 1B:
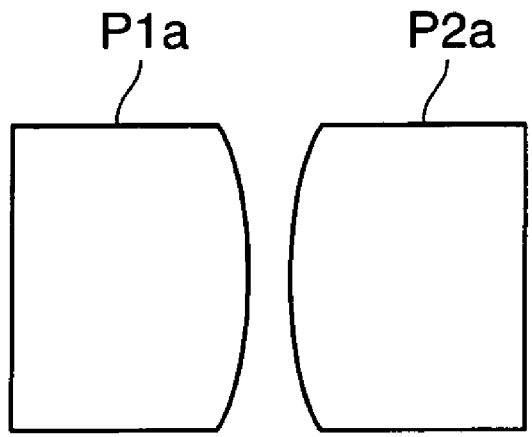
Figure 1C:
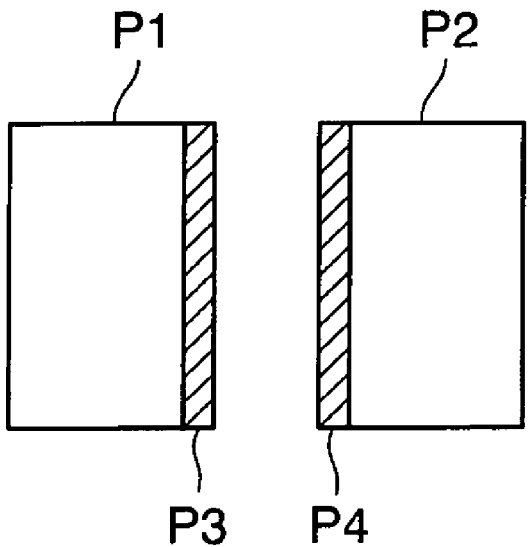

Descriptions will be provided below for an embodiment of the present invention by referring to the drawings.

First of all, descriptions will be provided for a configuration of an electron-beam exposure system and controllers thereof. Subsequently, descriptions will be provided for a configuration of a proximity-effect correcting module for correcting a proximity effect, and for a flow of data on exposure. Thereafter, descriptions will be provided for a process for correcting a proximity effect, and descriptions will be further provided for a case where the process for correcting a proximity effect is applied to a simple specific example. Finally, descriptions will be provided for a result of simulating a proximity-effect correction.

(Configuration of Electron-Beam Exposure System)

Figure 2:
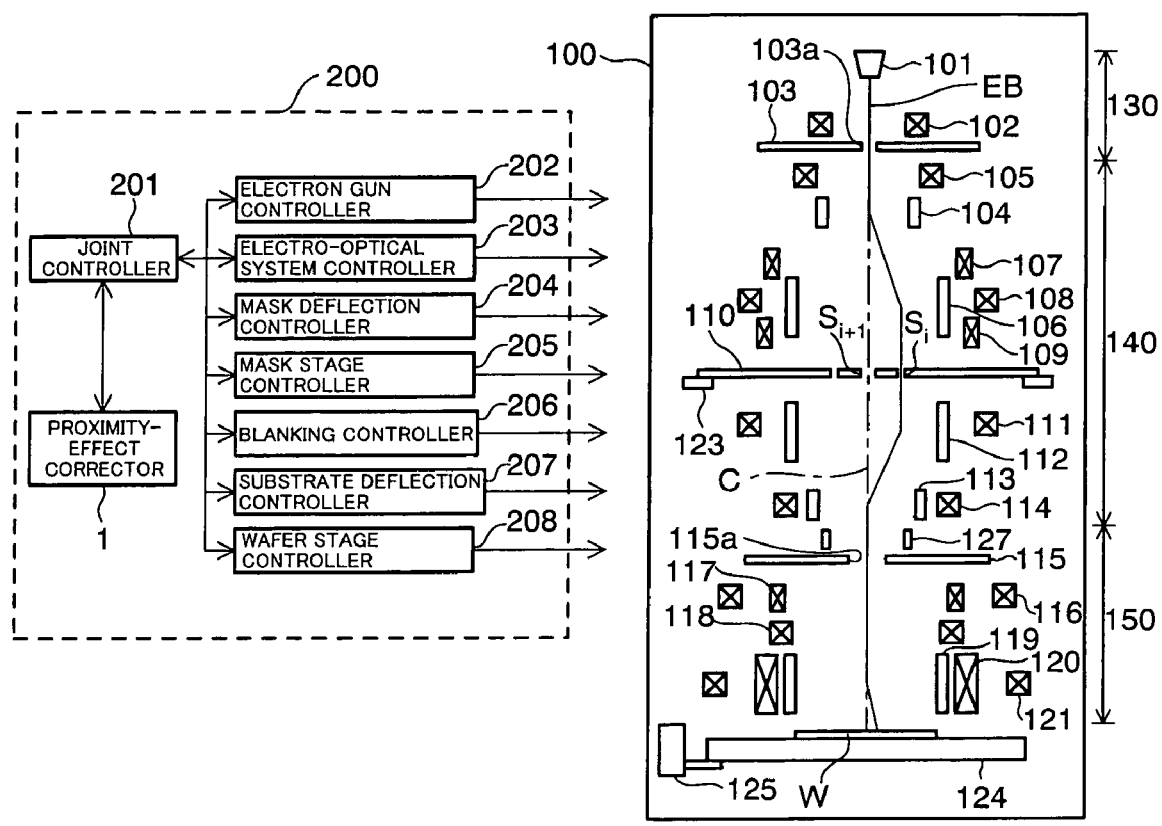
FIG. 2 is a diagram of a configuration of an electron-beam exposure system used in an embodiment of the present invention.

FIG. 2 is a diagram of a configuration of an electron-beam exposure system according to the embodiment of the present invention. This electron-beam exposure system is broken down into an electro-optical system column 100 and controller 200 for controlling the respective units in the electro-optical system column 100. Out of these two, the electro-optical system column 100 is configured of an electron-beam generating module 130, a mask deflection module 140 and a substrate deflection module 150. The pressure inside the electro-optical system 100 is reduced.

In the electron-beam generating module 130, an electron beam EB is generated by an electron gun 101, and is caused to undergo convergence effects in a first electromagnetic lens 102. Thereafter, the electron beam EB is transmitted through a rectangular aperture 103a of a beam shaping mask 103, and thus the cross section of the electron beam EB is shaped into a rectangle.

After that, the electron beam EB forms an image on an exposure mask 110 by means of a second electromagnetic lens 105 in the mask deflection module 140. Subsequently, the electron beam EB is deflected to a specific pattern S formed in the exposure mask 110 by means of a first and a second electrostatic deflectors 104 and 106. Thus, the cross section of the electron beam EB is shaped into the form of the pattern S.

It should be noted that, although the exposure mask 110 is fixed to a mask stage 123, the mask stage 123 is capable of being moved in a horizontal plane. In a case where the pattern S existing in a part beyond a deflection range (beam deflection area) of each of the first and the second electrostatic deflectors 104 and 106 is intended to be used, the pattern S is moved into the beam deflection area by moving the mask stage 123.

A third and a fourth electromagnetic lenses 108 and 111 arranged respectively above and under the exposure mask 110 play roles in causing the electron beam EB to form an image on a substrate W by adjusting amounts of current in the third and fourth electromagnetic lenses 108 and 111.

The electron beam EB, which has passed through the exposure mask 110, is swung back to the optical axis C by effects of a third and a fourth electrostatic deflectors 112 and 113. Thereafter, the size of the electron beam EB is reduced by a fifth electromagnetic lens 114.

The mask deflection module 140 is provided with a first and a second correction coils 107 and 109. These correction coils 107 and 109 correct aberration of the beam deflection generated by the first to the fourth electrostatic deflectors 104, 106, 112 and 113.

Thereafter, the electron beam EB passes through an aperture 115a of a shielding plate 115 constituting the substrate deflection module 150, and is projected onto the substrate W by means of a first and a second projection electromagnetic lenses 116 and 121. Thereby, an image of a pattern of the exposure mask 110 is transferred onto the substrate W with a predetermined reduction ratio, for example, with a ratio of 1/60.

The substrate deflection module 150 is provided with a fifth electrostatic deflector 119 and an electromagnetic deflector 120. The deflectors 119 and 120 deflect the electron beam EB. Thereby, the image of the pattern of the exposure mask is projected onto a predetermined position in the substrate W.

Furthermore, the substrate deflection module 150 is provided with a third and a fourth correction coils 117 and 118 for correcting the deflection aberration of the electron beam EB on the substrate W.

The substrate W is fixed to a wafer stage 124 capable of being moved in the horizontal direction by a drive unit 125 such as a motor. By moving the wafer stage 124, the exposure can be applied to the entire surface of the substrate W.

(Description of Controllers)

On the other hand, the control module 200 is provided with an electron gun controller 202, an electro-optical system controller 203, a mask deflection controller 204, a mask stage controller 205, a blanking controller 206, a substrate deflection controller 207, a wafer stage controller 208 and a proximity-effect correcting module 1. Out of these units, the electron gun controller 202 controls the electron gun 101, and thereby controls an acceleration voltage of the electron beam EB, conditions for beam irradiation, and the like. In addition, the electro-optical system controller 203 controls an amount of current and the like to each of the electromagnetic lenses 102, 105, 108, 111, 114, 116 and 121. Thereby, the electro-optical system controller 203 adjusts magnifications, focal positions and the like of the electro-optical system in which these electromagnetic lenses are constructed. The blanking controller 206 controls a voltage applied to a blanking electrode 127. Thereby, the blanking controller 206 deflects the electron beam EB onto the shielding plate 115, the electron beam EB being generated before starting the exposure, and having since been generated. Thus, the blanking controller 206 prevents the electron beam EB from being irradiated on the substrate W before the exposure.

The substrate deflection controller 207 controls a voltage applied to the fifth electrostatic deflector 119, and an amount of current to the electromagnetic deflector 120. Thereby, the substrate deflection controller 207 deflects the electron beam EB to the predetermined position in the substrate W. The wafer stage controller 208 adjusts an amount of drive of the drive unit 125, and thereby moves the substrate W in the horizontal direction so that the electron beam EB is irradiated on the predetermined position in the substrate W. The foregoing controllers 202 to 208 are jointly controlled by a joint controller 201 such as a workstation on the basis of data calculated by the proximity-effect correcting module 1 in order that an appropriate exposure can be obtained through the data.

Figure 3:
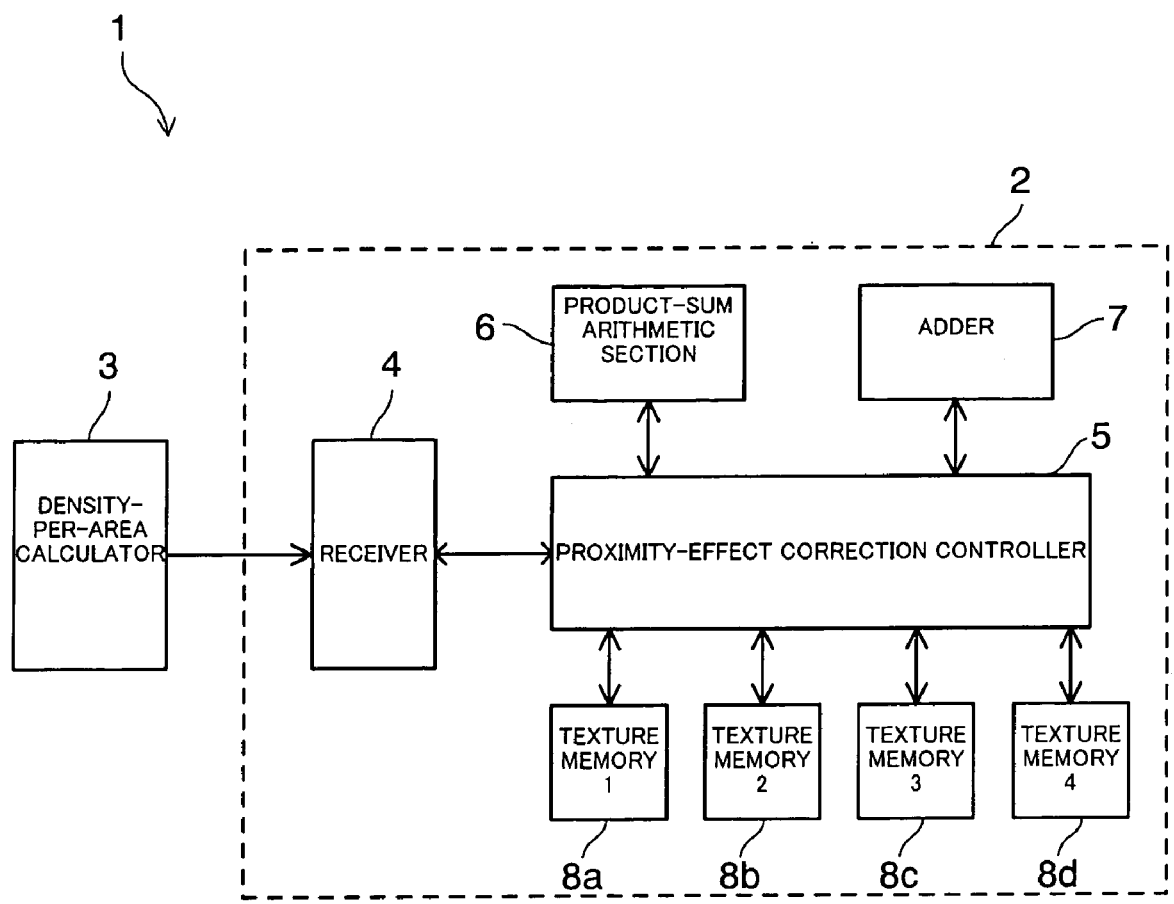
FIG. 3 is a diagram of a configuration of a proximity-effect correcting module in the electron-beam exposure system shown in FIG. 2.

FIG. 3 is a block diagram showing a configuration of the proximity-effect correcting module 1. The proximity-effect correcting module 1 is configured to include a proximity-effect correction calculator 2 and an density-per-area calculator 3.

The density-per-area calculator 3 divides an exposure region in a workpiece into meshes each with a predetermined size, and thus calculates a ratio (density per area) of the area of patterns on which the electron beam is going to be irradiated to the area of each of the meshed regions. Subsequently, the density-per-area calculator 3 creates a density-per-area map for indicating the density per area in each of the meshes.

The proximity-effect correction calculator 2 is configured of a receiver 4, texture memories 8, a product-sum arithmetic section 6, an adder 7 and a proximity-effect correction controller 5. The receiver 4 receives data obtained by calculating the density per area. The received data are stored in the texture memories 8. The product-sum arithmetic section 6 and the adder 7 process the data stored in the texture memories 8. The proximity-effect correction controller 5 controls a sequence of processing the data.

(Flow of Data on Exposure)

Figure 4:
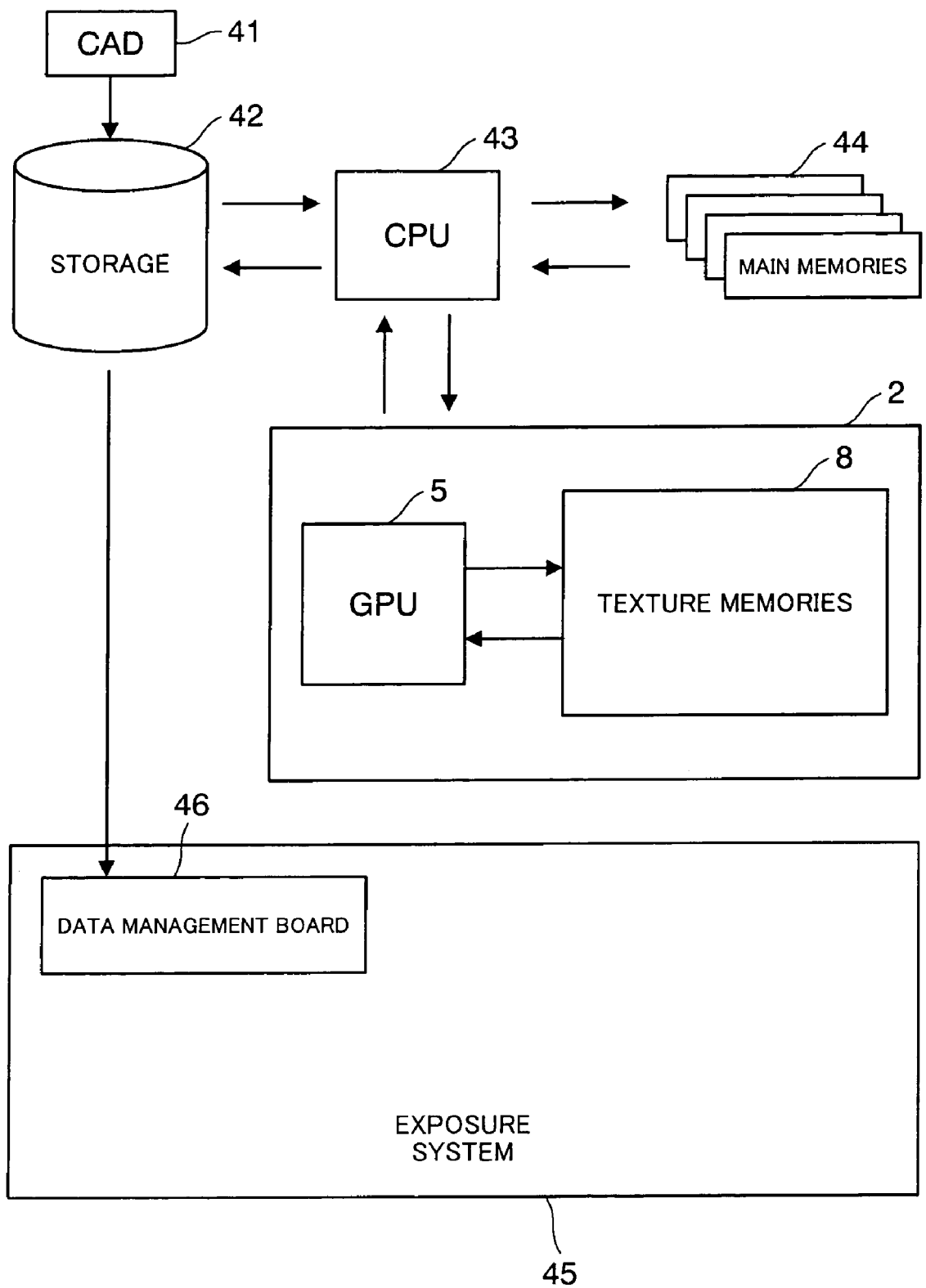
FIG. 4 is a diagram showing a flow of data on exposure

FIG. 4 is a diagram showing a flow of data on exposure. After CAD data 41 including information on exposure patterns and information on circuits are inputted to a storage 42, the process of correcting the proximity effect is carried out on the basis of the data.

A CPU 43 extracts data on exposure from the storage 42, and does things such as calculating the density per area. Thereafter, the CPU 43 transfers the resultant data to the proximity-effect correction calculator 2. The proximity-effect correction calculator 2 figures out D (an exposure distribution) through the successive substitution method by use of a shader on the basis of Equation (1) expressing the distribution function of accumulated energy in which influence of back scattering of the electron beam is taken into consideration.

The calculated exposure distribution is transferred to the CPU 43 again. The CPU 43 sum up the calculated exposure distribution and an exposure distribution which has been calculated by use of main memories 44, and in which influence of forward scattering of the electron beam is taken into consideration. Thus, the CPU 43 calculates an appropriate data on exposure, and stores the resultant data on exposure in the storage 42. The appropriate data on exposure is transferred to a data management board 46 of an exposure system 45. The exposure and the like are controlled on the basis of the data, and thereby the electron beam exposure is performed. Accordingly, patterns each with the desired size are obtained.

Figure 5:
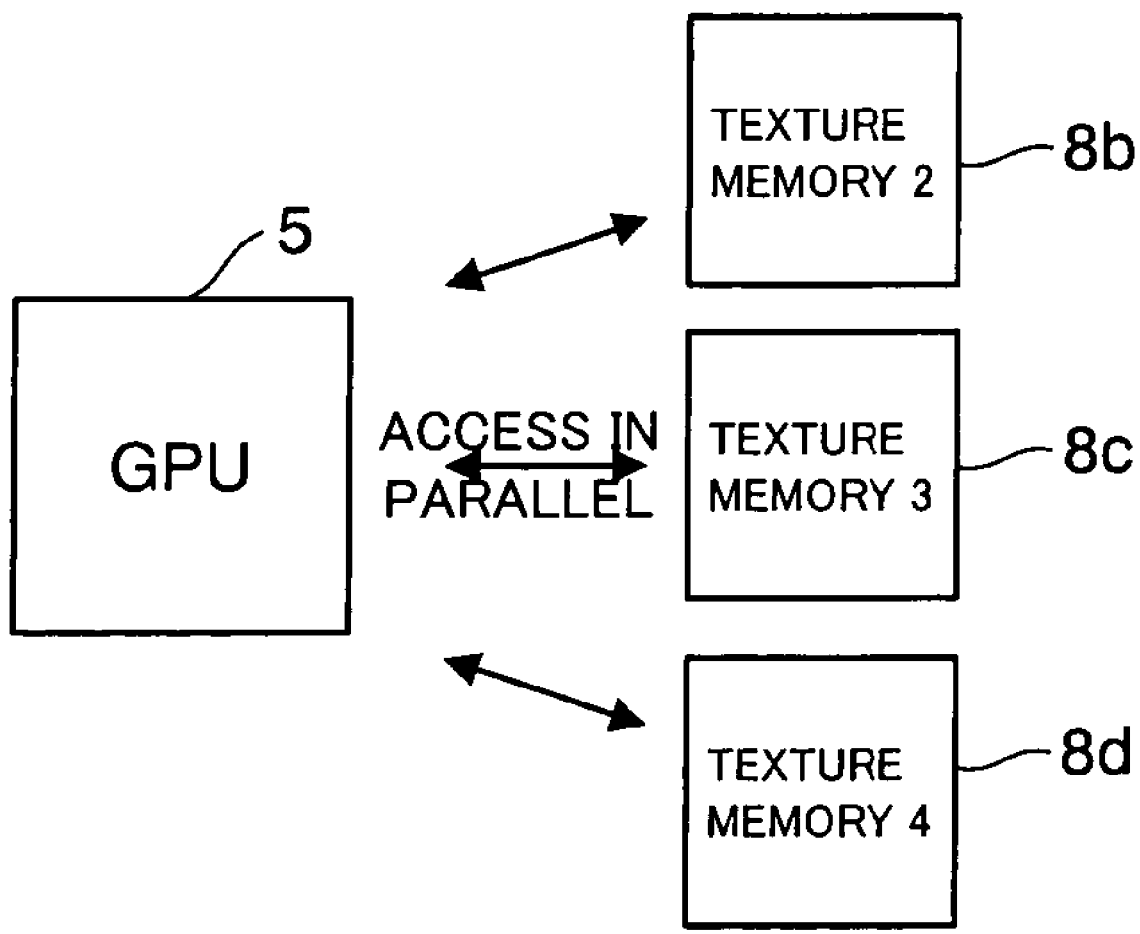
FIG. 5 is a diagram showing a flow of the data on exposure in a proximity-effect correction calculator.

FIG. 5 is a diagram showing a flow of data inside the proximity-effect correction calculator 2. The interior of the proximity-effect correction calculator 2 is configured of a graphical processing unit (GPU 5) and texture memories 8 which the GPU 5 can access in parallel.

As described below, the densities per area which have been calculated through dividing the exposure region into the plurality of meshes are stored, as array data, in the texture memories 8. In this case, the number of array data corresponds to the number of the meshes. In addition, four texture memories 8 are got ready for this storage. Three out of the four texture memories are used so that two-dimensional array data indicating the densities per area are processed. Finally, the texture memories 8 are controlled by the GPU 5 in order to obtain the appropriate data on exposure.

(Process of Correcting Proximity Effect)

Figure 6:
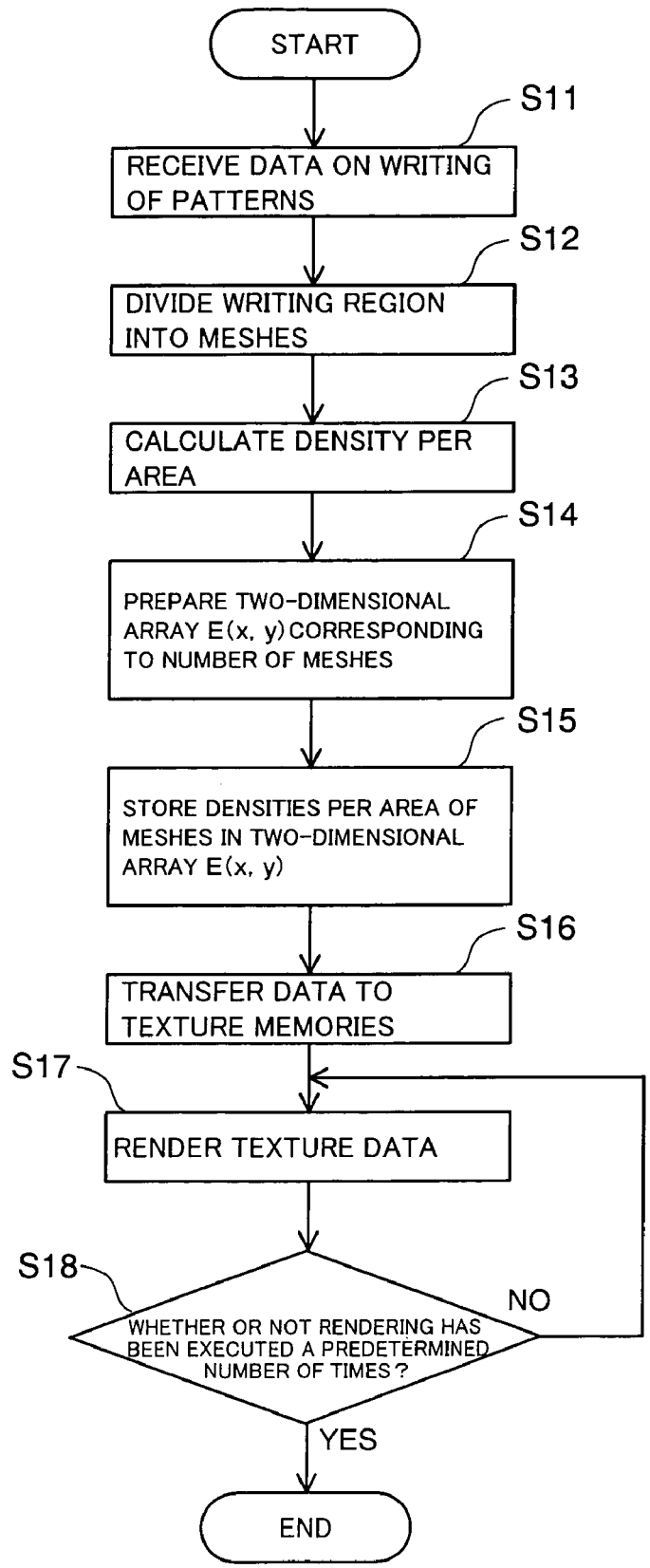
FIG. 6 is a flowchart of a process of correcting a proximity effect according to the embodiment of the present invention.

Descriptions will be provided below for a process of correcting the proximity effect by referring to a flowchart shown in FIG. 6.

For this embodiment, it is assumed that there is no effect of the forward scattering, and an equation in which only the back scattering is taken into consideration is dealt with. As described above, the distribution function of accumulated energy of the electron beam, in which the proximity effect is taken into consideration, is expressed with Equation (1). Neumann series expansion is applied to Equation (1), and thereby Equation (1) is solved in terms of D (the exposure distribution). Thus, energy of the electron beam needed for irradiating the electron beam on the meshes is figured out. On the basis of this, the appropriate exposure is calculated.

First of all, data on the writing of patterns to be formed are received in step S11.

Subsequently, a certain writing region on which the electron beam is irradiated is divided into the meshes each with the predetermined size in step S12. For example, a chip is divided into squares each with a side of approximately 2.048 mm. Subsequently, each of the squares is divided into 2048×2048 meshes each with a side of approximately 1 µm.

Thereafter, the densities per area are calculated in step S13. The density-per-area calculator 3 calculates the densities per area. This calculation is carried out on the basis of a value on the area of desired patterns included in each of the meshes. For example, the density-per-area calculator 3 figures out the area of the patterns included in each of the meshes each with the side of 1 µm, and thus figures out a ratio of the area of the patterns to the area of the meshes.

Subsequently, the two-dimensional array is prepared, and the number of array elements in the two-dimensional array corresponds to the number of the meshes in step S14. For example, if the number of the meshes is 2048×2048, two-dimensional array E(x,y) in which the number of array elements is 2048×2048 is prepared.

Thereafter, the densities per area which have been calculated by the density-per-area calculator 3 are stored respectively in the two-dimensional array E(x,y) in step S15. For example, each of array components takes on a value in a range of zero to one in a way that one denotes a case where a meshed region is fully covered with patterns, and zero denotes a case where there is no pattern.

After that, data on density per area which have been stored in the two-dimensional array E(x,y) are transferred to the texture memories 8 in step S16. Each of the texture memories has a configuration in which data on pixels are arrayed two-dimensionally. For this reason, the array components of the two-dimensional array E(x,y) can be stored in the texture memories 8 by use of the same format as the texture memories have.

It should be noted that each of the data on pixels in the texture memories 8 can express R, G, B and A (intensities respectively of the three primary colors and an alpha-blending coefficient). Although depending on the hardware, each of the data can be expressed with an amount of information equivalent to 8 bits, 16 bits or 32 bits. As a result, if data on density per area of one mesh are associated with any one of R, G, B and A, this makes it possible to process data on a mesh which is four times as large as the texture size.

Subsequently, in step S17, the texture data stored in the texture memories 8 are rendered (are caused to undergo a writing process), and thereby the densities per area are processed.

Thereafter, in step S18, it is determined whether or not the rendering has been executed a predetermined number of times. In a case where the rendering has been executed the predetermined number of times, the process of correcting the proximity effect is terminated. In a case where the rendering has not been executed the predetermined number of times, the process returns to step S17, and repeats the rendering.

In this embodiment, the following four types of rendering algorithms GX, GY, ADD and PROD are used. These algorithms are capable to be implemented as one pass of the shader (one rendering) by use of a language such as HLSL (High Level Shader Language), GLSL (openGL Shader Language) or the like, which are designed for controlling pixel pipelines.

Figure 7:
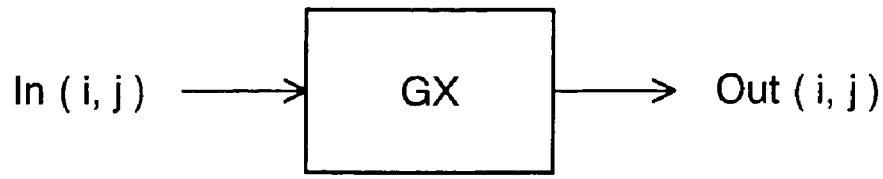
FIG. 7 is a diagram for explaining a rendering algorithm used for the embodiment of the present invention.
Figure 7:
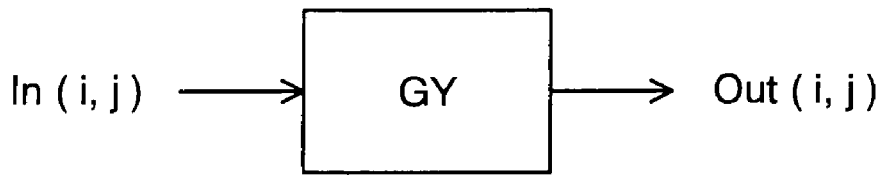
Figure 7:
Figure 7:
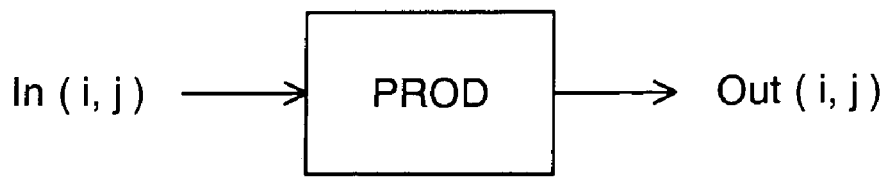

The GX rendering algorithm performs convolution on the Gaussian distribution in the X direction and the data on pixels. As shown in FIG. 7, an output from each pixel (corresponding to four meshes in this embodiment) is a sum of data neighboring a corresponding input pixel in the X direction after assigning the Gaussian distribution to the neighboring data.

The GY rendering algorithm performs convolution on the Gaussian distribution in the Y direction and the data on pixels. As shown in FIG. 7, an output from each pixel is a sum of data neighboring a corresponding input pixel in the Y direction after assigning the Gaussian distribution to the neighboring data.

The ADD rendering algorithm performs addition. As shown in FIG. 7, the ADD rendering algorithm assigns specified weighs respectively to pixel components in two texture data (Ina, Inb), and adds up the resultant pixel components, thus writing out the result in an output texture. In addition, the ADD rendering algorithm includes a function of adding an arbitrary constant to each of the pixels.

The PROD rendering algorithm performs multiplication. As shown in FIG. 7, the PROD rendering algorithm multiplies the pixel components in the two texture data (Ina, Inb), and writes out the product in the output texture.

These rendering operations (writing operations) on texture data from one to another are repeated, and thus the exposure distribution needed for correcting the proximity effect is figured out.

In the case of this embodiment, the data are converted among the texture memories 8 through only the addition and the multiplication in the foregoing manner. In the data conversion process, division is not used. As a result, this embodiment makes it possible to increase the rate in which the calculation is performed. In addition, the implementation of these rendering algorithms in the shader makes it possible to perform the operation on the texture memories 8 in parallel, and accordingly to perform these operations at high speed. Although how many operations can be performed in parallel depends on the hardware, this embodiment makes it possible to process 16 pipelines, for example.

In addition, while the GPU 5 is performing the calculating process on the influence of the back scattering, the CPU 43 is not utilized for calculation the influence of the back scattering. As a result, it is possible to calculate the influence of the back scattering in the GPU 5, and to calculate the influence of the forward scattering in CPU 43 simultaneously. This makes it possible to efficiently correct the proximity effect.

SPECIFIC EXAMPLE

Figure 8:
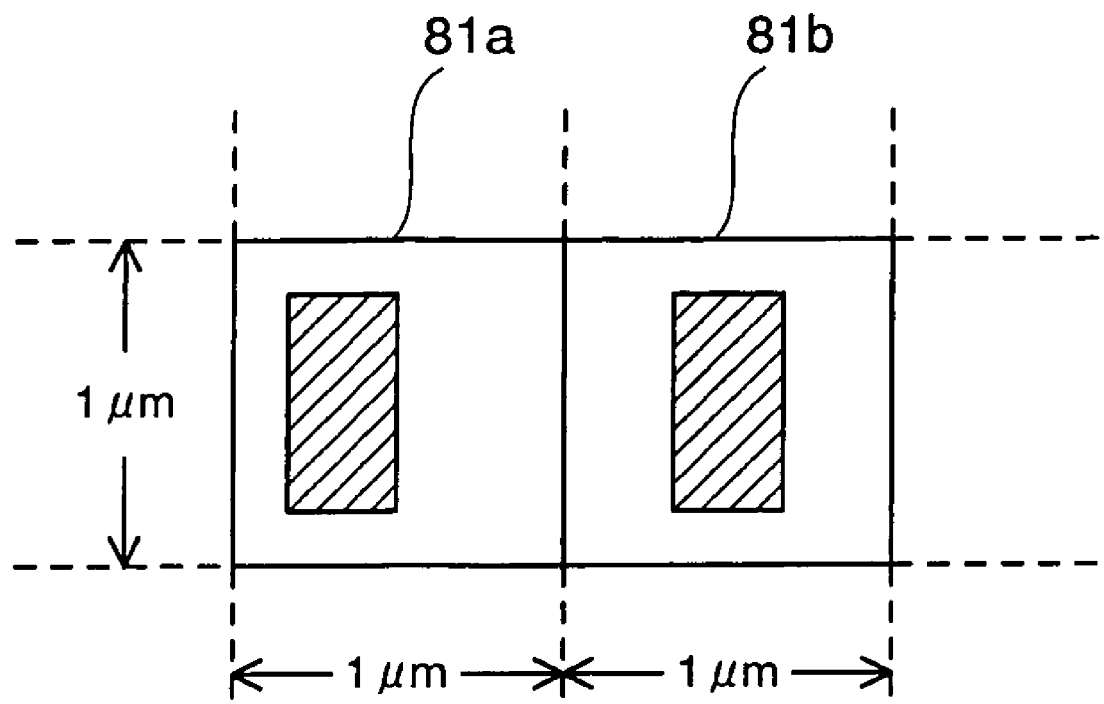
FIG. 8 is a diagram for describing a specific example of the embodiment.

Descriptions will be provided below for an example of correcting the proximity effect on the basis of the distribution function of accumulated energy shown in Equation (1). The descriptions will be provided by taking a case where, as shown in FIG. 8, there are two meshed regions (regions 81$a$ and 81$b$) as an example. For instance, a case where the size of one mesh is 1 μm×1 μm and all the patterns are included in a 1 μm×2 μm region will be taken as an example.

Equation (1) can be expressed with Equation (2) by use of a matrix.

$$2\begin{pmatrix} E_{81a} \\ E_{81b} \end{pmatrix} = \begin{pmatrix} D_{81a} \\ D_{81b} \end{pmatrix} + \frac{2\eta}{\pi} \begin{pmatrix} p_{81a} & \exp\left(-\frac{1^2}{\beta^2}\right)p_{81b} \\ \exp\left(-\frac{1^2}{\beta^2}\right)p_{81a} & p_{81b} \end{pmatrix} \begin{pmatrix} D_{81a} \\ D_{81b} \end{pmatrix} \quad \text{Equation (2)}$$

In Equation (2), the first term of the right-hand side is set up in assumption that all the imparted exposure contributes to the accumulated energy E with the influence of the forward scattering ignored, in common with Equation (1). In addition, the second term is a term expressing the back scattering. The diagonal components in the second term denote energy which contributes to the accumulated energy through the following behavior. After the electron beam is irradiated on one of the two regions, part of the electron beam bounces back to the same region, and the partial electron beam brings about the contributing energy. The non-diagonal components in the second term denote energy which contributes to the accumulated energy through the following behavior. After the electron beam is irradiated on the same region, part of the electron beam bounces to the different region, and the partial electron beam brings about contributing energy. The ratio of the energy of the partial electron beam bouncing back to the different region to the overall accumulated energy is expressed with the Gaussian distribution using the distance between the two regions as a parameter. Incidentally, π denotes a normalization constant for the two-dimensional Gaussian distribution.

When the matrix in the right-hand side of Equation (2) is replaced with M, Equation (3) is obtained.

$$M = \frac{2\eta}{p}\begin{pmatrix} p_{81a} & \exp\left(-\frac{1^2}{\beta^2}\right)p_{81b} \\ \exp\left(-\frac{1^2}{\beta^2}\right)p_{81a} & p_{81b} \end{pmatrix} \quad \text{Equation (3)}$$

A part of the second term of the right-hand side of Equation (3) is transposed to the first term of the right-hand side thereof, Equation (4) is obtained.

$$2\begin{pmatrix} E_{81a} \\ E_{81b} \end{pmatrix} = (1+\eta)\begin{pmatrix} D_{81a} \\ D_{81b} \end{pmatrix} + (M-\eta)\begin{pmatrix} D_{81a} \\ D_{81b} \end{pmatrix} \quad \text{Equation (4)}$$

When Equation (4) is further modified, Equation (5) is obtained.

$$\begin{pmatrix} D_{81a} \\ D_{81b} \end{pmatrix} = \frac{2}{1+\eta}\begin{pmatrix} E_{81a} \\ E_{81b} \end{pmatrix} - \frac{M-\eta}{1+\eta}\begin{pmatrix} D_{81a} \\ D_{81b} \end{pmatrix} \quad \text{Equation (5)}$$

If the Neumann series expansion is performed on Equation (5), Equation (5) can be solved in terms of D. In other words, D in the left-hand side of Equation (5) is successively substituted into the D in the right-hand side thereof. If the coefficient term of D in the right-hand side takes on zero or can be approximated to zero, D can be expressed with E. Thereby, the appropriate exposure can be calculated.

In this respect, whether or not the coefficient of D in the right-hand side converges to zero can be determined by determining whether the maximum value of the absolute value of an eigenvalue of (M−η)/(1+η) is larger, or smaller, than one. In the case of this embodiment, no matter what value B, p81$a$, p81$b$ and η took on, respectively, in a range of their possible values, it was figured out through a calculation that the maximum value of the absolute value of the eigenvalue of (M−η)/(1+η) was smaller than one.

As a result, the absolute value of (M−η)$^2$/(1+η)$^2$ which is obtained by performing the rendering operations GX and GY by using the two-dimensional array data (M−η)/(1+η) as an input is always smaller than the absolute value of the input.

The modification of Equation (1) to Equation (5) in this manner causes the coefficient of D in the right-hand side of the Equation (5) to converge to zero. This ensures that an exact value of D is obtained.

It should be noted that, if the successive substitution is performed up to seven times, that is, if D in the left-hand side of Equation (5) is substituted into D in the right-hand side thereof seven times by performing the rendering operation repeatedly, the coefficient matrix converges to zero. For this reason, in this embodiment, the successive substitution is performed up to seven times, and thus a series sum obtained by replacing D in the right-hand side of Equation (5) with E is used as an approximate solution.

The descriptions have been provided by taking the case of the two meshed regions as an example. An actual practice is that the number of divided regions is larger for the purpose of figuring out the exposure distribution more exactly. In a case where, for example, a 10 mm×10 mm chip is divided into meshes each of which is a 1 μm×1 μm square, the number of divided regions is $10^8$. Even in this case, the number of components in the matrix increases, and the procedure of the calculation for figuring out the data on appropriate exposure is similar to the method which has been described for this embodiment.

An example of calculating the appropriate exposure will be shown below by use of Equation (5).

Figure 9:
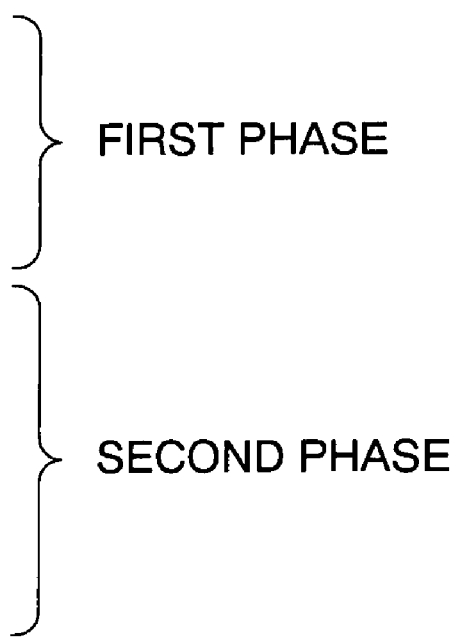
FIG. 9 is a diagram for showing an example of application of the rendering algorithm used for the specific example of the embodiment.

FIG. 9 shows an example of application of the rendering algorithms for figuring out the appropriate exposure from the density per area.

Incidentally, it is assumed that irradiated energy per unit area of the electron beam is constant. In this respect, if no proximity effect would exist, the accumulated energy E could be expressed as multiplication of the density per area p by the constant. For this reason, a solution is figured out by replacing the accumulated energy E in equation (5) with the density per area p.

Furthermore, the four texture memories $B_0$ to $B_3$ are used in this case. Out of the four texture memories, $B_0$ is used for read only, and $B_1$ to $B_3$ are used for both read and write.

First of all, the density per area p indicating the ratio of coverage by patterns to each mesh is stored in the read only buffer $B_0$.

Subsequently, the data (density per area) in $B_0$ is converted by use of the rendering algorithm GX, and the resultant data is transferred to $B_1$, as shown in FIG. 9. This corresponds to performing convolution arithmetic on the Gaussian distribution in the X direction and data on pixels (the area of patterns included in the mesh) in terms of the original density per area. In other words, a value to be obtained by adding up influence of back scattering from within ±3β meshes neighboring a particular mesh is calculated.

Thereafter, the data in $B_1$ is converted by use of the rendering algorithm GY, and the resultant data is transferred to $B_2$. In other words, a value to be obtained by adding the influence of the back scattering in the Y direction to the density per area obtained by calculating the influence of the back scattering in the X direction is calculated.

Subsequently, the data in $B_2$ and the data in $B_0$ are added up by use of the rendering algorithm ADD, and the sum is transferred to $B_3$. In other words, the density per area obtained by calculating the influence of the back scattering in the X direction and in the Y direction, and the original density per area are added up. This makes it possible to figure out the density per area by taking the influence of the back scattering in the surroundings into consideration.

Completion of the process up to this means that the first phase of the rendering operation shown in FIG. 9 is completed, and that, as a result, the first phase of the calculation is completed. In other words, this is equivalent to the calculation having been carried out by replacing D in the right-hand side of Equation (5) with E.

Subsequently, when the second phase of the rendering operation shown in FIG. 9 is completed, this means that Equation (5) has been carried out up to the second phase. In other words, this is equivalent to substituting the result of performing the first phase of the rendering operation into D in the right-hand side of Equation (5).

The calculation as described above is carried out repeatedly a predetermined number of times, the number being equal to the number of paths. For example, (4n−1) paths (conversion operations) are needed for carrying out the calculation repeatedly up to the nth phase. 27 conversion operations are needed for carrying out the calculation repeatedly up to the 7th phase. It takes approximately three minutes to perform these operations if a graphic chip GeForce 6600 with a 300 MHz core clock speed and a 500 MHz memory clock speed in the operation clock.

(Result of Simulated Calculation)

Figure 10A:
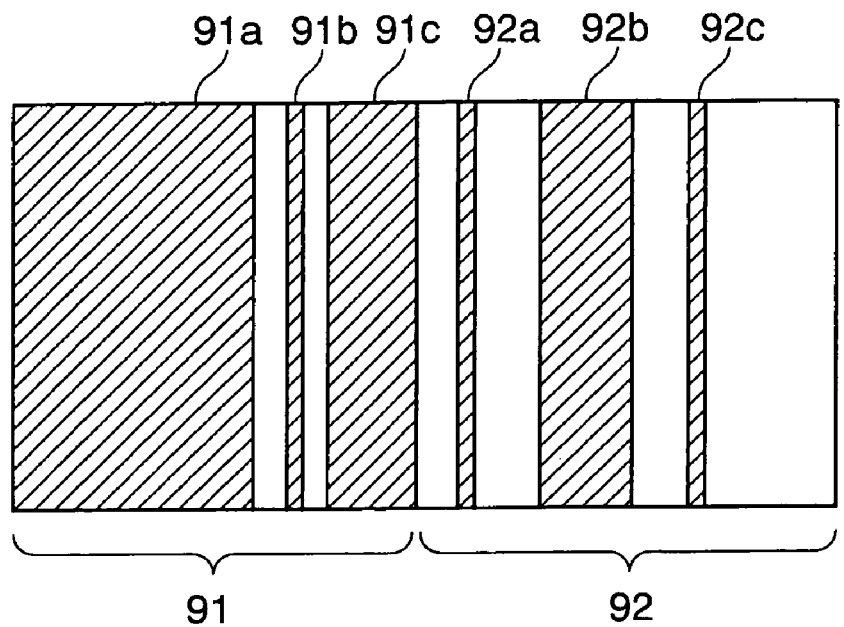
FIG. 10A is a diagram showing an example of patterns being objects on which a proximity-effect correction is simulated.

FIG. 10A shows a result of performing the proximity effect correction according to this embodiment on predetermined patterns. The proximity effect correction is applied to a case where patterns 91a to 91c exist in a region 91 and patterns 92a to 92c exist in a region 92, as shown in FIG. 10A.

Figure 10B:
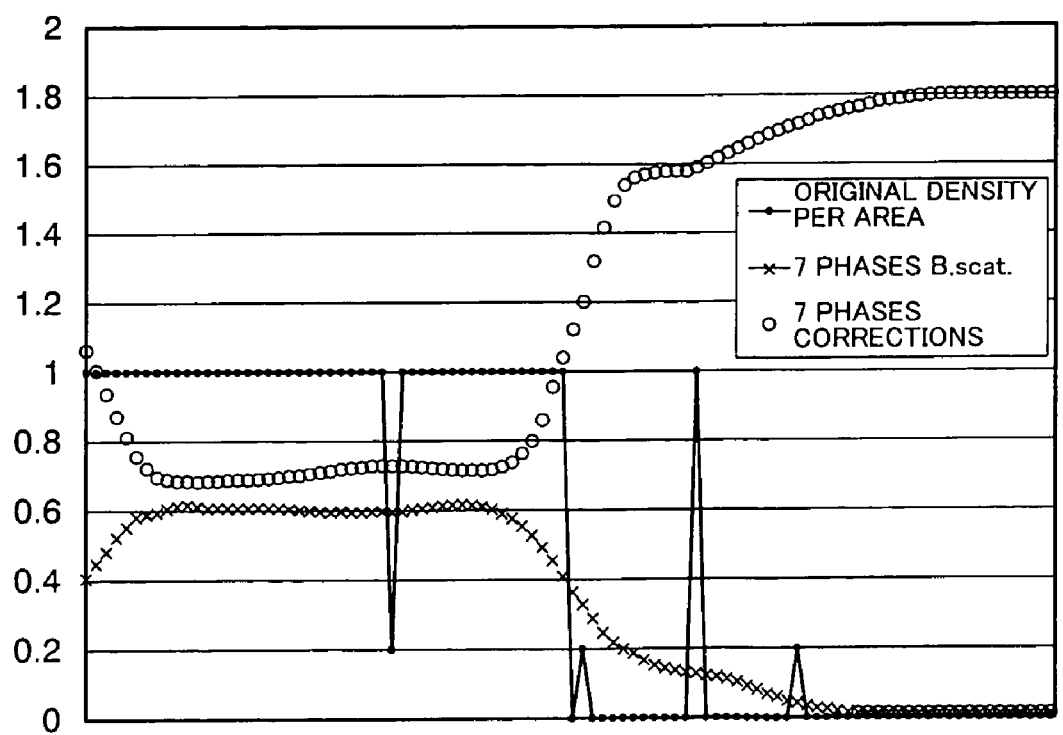
FIG. 10B is a diagram showing a result of simulating the proximity-effect correction.

FIG. 10B is a diagram showing a result of figuring out the exposure distribution through simulated calculation by performing the proximity effect correction according to this embodiment on the patterns shown in FIG. 10A. In FIG. 10B, the horizontal axis indicates a position, and the vertical axis indicates the amount of accumulated energy. A line plotted with • in FIG. 10B indicates the distribution of accumulated energy provided by the density per area of the patterns shown in FIG. 10A. In addition, a line plotted with × indicates how the distribution of accumulated energy provided by the original density per area changes due to the influence of the back scattering. Moreover, the line plotted with o indicates a result of the simulated calculation in which the 7 phases of the proximity effect correction are performed by use of the method of correcting the proximity effect according to the present invention. Incidentally, it is assumed that energy obtained by irradiation of the electron beam is constant per unit area.

As shown by the line plotted with × in FIG. 10B, due to the influence of the back scattering, the closer to the peripheral portion of the region 91, the lower the distribution of accumulated energy becomes. In addition, in the region 92, the distribution of accumulated energy gradually decreases in a range from the inner vicinity to the outer vicinity of the boundary between the regions 91 and 92.

It is learned that, for the purpose of correcting such a proximity effect, it suffices that the exposure is corrected in order to cause the distribution of accumulated energy to agree with the line plotted with o in FIG. 10B. For example, the distribution of accumulated energy increases depending on how close to the periphery of the region 91. For this reason, the closer to the periphery of the region 91, the larger exposure needs to be imparted. As a result, if an exposure shot is performed on the location for a longer time, this makes it possible to form a desired pattern.

It takes 10 odd hours to carry out up to 7 phases of the calculation by use of the CPU without processing the conventional equation including division in parallel. It should be noted, however, that the method of correcting the proximity effect according to this embodiment makes it possible to carry out the calculation in approximately three minutes, and to accordingly increase the execution speed to a large extent.

As described above, in the case of this embodiment, the density-per-area map is created, and thereafter each of the densities per area of the respective meshes is associated with the two-dimensional array data. Thus, the resultant data on density per area are transferred to the texture memories 8. The data conversion process is performed repeatedly on the data on density per area transferred to the texture memories 8 a predetermined number of times. This makes it possible to perform the Neumann series expansion on the distribution function of accumulated energy, to thus solve the distribution function of accumulated energy in terms of D by successive substitution, and to accordingly correct the proximity effect. In this case, the proximity effect can be corrected at high speed, since only the multiplications and the additions are used while no division is used.

In addition, the performing of the foregoing process by use of the shader makes it possible to perform the data conversions in parallel, and to accordingly correct the proximity effect at remarkably higher speed than before.

Moreover, this embodiment provides a calculation result that the maximum value of the absolute value of the output from a linear functional unit is smaller than the maximum value of the absolute value of the input to the linear functional unit. This ensures that the results of the arithmetic converge. Accordingly, the proximity effect can be corrected precisely.

What is claimed is:

1. An electron-beam exposure system comprising:
   density-per-area map generating means configured to divide a certain area on which an electron beam is irradiated into meshes, to figure out a ratio of an area of patterns to be irradiated on each divided region to an area of the divided region, thus to generate a density-per-area map; and
   proximity-effect correcting means configured to correct exposure of the electron beam by referring to the density-per-area map,
   wherein the proximity-effect correcting means includes product-sum arithmetic means which is configured to perform product-sum arithmetic on two-dimensional array data, and addition means which is configured to perform addition arithmetic on the two-dimensional array data,
   the proximity-effect correcting means stores, in a first memory, two-dimensional array data on a density per area of patterns included in each of the meshes, performs the product-sum arithmetic and the addition a predetermined number of times, and thus calculates the two-dimensional array data on the density per area by a linear conversion, subsequently storing, in a second memory, the resultant data as two-dimensional array data of data on exposure to be used for correcting a proximity effect.

2. The electron-beam exposure system according to claim 1, wherein, when performing the linear conversion from a first two-dimensional array data to a second two-dimensional array data, the product-sum arithmetic means assigns a weight to data on peripheries respectively of the meshes of the first two-dimensional array data, and thus performs addition.

3. The electron-beam exposure system according to claim 2, wherein the weight to be assigned to the data on the peripheries is a value of a Gaussian distribution indicating how much a region of the peripheries is influential on the meshes.

4. The electron-beam exposure system according to claim 1, wherein the product-sum arithmetic means performs a convolution integral on data on meshes neighboring each of the meshes in a X direction and a value of a Gaussian distribution, and performs a convolution integral on data on meshes neighboring each of the meshes in a Y direction and the value of the Gaussian distribution.

5. The electron-beam exposure system according to claim 1, wherein in the product-sum arithmetic means, a maximum value of an absolute value of a second two-dimensional array data obtained by inputting a first two-dimensional array data is smaller than a maximum value of an absolute value of the first two-dimensional array data.

6. The electron-beam exposure system according to claim 1, wherein the addition means assigns predetermined weights respectively to components of two sets of two-dimensional data, and thus adds up the resultant components.

7. The electron-beam exposure system according to claim 1, wherein the product-sum arithmetic and the addition are performed by a shader.

8. The electron-beam exposure system according to any one of claims 1 to 7, wherein electron-beam exposure is performed based on data on exposure which is obtained by the proximity-effect correcting means.

* * * * *